United States Patent
Ofner et al.

(10) Patent No.: US 7,768,137 B2
(45) Date of Patent: Aug. 3, 2010

(54) SEMICONDUCTOR CHIP WITH FLIP CHIP CONTACTS AND A PASSIVATION LAYER WITH VARYING THICKNESS PORTIONS SURROUNDING CONTACT SURFACES OF THE SEMICONDUCTOR CHIP

(75) Inventors: Gerald Ofner, Singapore (SG); Ai Min Tan, Singapore (SG); Mary Teo, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 936 days.

(21) Appl. No.: 11/429,433

(22) Filed: May 8, 2006

(65) Prior Publication Data
US 2006/0270163 A1    Nov. 30, 2006

Related U.S. Application Data

(63) Continuation of application No. PCT/DE2004/002440, filed on Nov. 3, 2004.

(30) Foreign Application Priority Data
Nov. 6, 2003    (DE)    ................. 103 52 349

(51) Int. Cl.
*H01L 23/48* (2006.01)
*H01L 23/50* (2006.01)
*H01L 23/485* (2006.01)

(52) U.S. Cl. .................. 257/778; 257/E23.021; 257/E23.069; 257/E21.503; 257/775; 257/776; 257/734; 257/737; 257/738; 257/700; 257/701; 257/758; 257/780; 257/784; 257/783; 438/275; 438/108

(58) Field of Classification Search .................. 257/778, 257/E21.503, E23.021, E23.069, 737, 738, 257/734, 775, 776, 701, 700, 780, 531, 783, 257/784; 438/275, 108
See application file for complete search history.

(56) References Cited

U.S. PATENT DOCUMENTS

| 5,844,782 | A |    | 12/1998 | Fukasawa |
| 5,874,356 | A |    | 2/1999 | Chen et al. |
| 5,943,597 | A |    | 8/1999 | Kleffner et al. |
| 6,313,541 | B1 |   | 11/2001 | Chan et al. |
| 6,475,829 | B2 | * | 11/2002 | Hatauchi et al. ............ 438/108 |
| 6,492,692 | B1 |   | 12/2002 | Ishii et al. |
| 6,586,844 | B1 | * | 7/2003 | Chang ......................... 257/779 |
| 6,891,274 | B2 | * | 5/2005 | Chen et al. .................. 257/780 |
| 6,969,905 | B2 |   | 11/2005 | Paulus |

(Continued)

FOREIGN PATENT DOCUMENTS

EP    1 205 970 A2    5/2002

(Continued)

*Primary Examiner*—Alexander O Williams
(74) *Attorney, Agent, or Firm*—Edell, Shapiro & Finnan, LLC

(57) ABSTRACT

A semiconductor chip includes flip chip contacts that are arranged on contact surfaces of an active top side of the semiconductor chip. The contact surfaces are surrounded by a passivation layer that covers the active top side while leaving exposed the contact surfaces. The passivation layer includes thickened portions that surround the contact surfaces. The semiconductor chip formed with thickened portions around the contact surfaces is protected from delamination during packaging of the semiconductor chip to form a semiconductor device.

13 Claims, 3 Drawing Sheets

U.S. PATENT DOCUMENTS

| | | |
|---|---|---|
| 2001/0028110 A1 | 10/2001 | Andoh |
| 2002/0056906 A1* | 5/2002 | Kajiwara et al. ............ 257/697 |
| 2002/0115280 A1 | 8/2002 | Lin et al. |
| 2002/0121705 A1 | 9/2002 | Pu et al. |
| 2003/0087475 A1 | 5/2003 | Sterrett et al. |
| 2004/0113273 A1* | 6/2004 | Chen et al. ................. 257/737 |
| 2007/0145603 A1* | 6/2007 | Jeong ........................ 257/778 |

FOREIGN PATENT DOCUMENTS

| | | |
|---|---|---|
| JP | 1123544 | 5/1989 |
| JP | 5226339 | 9/1993 |
| JP | 6029448 | 2/1994 |
| JP | 2003 158 141 | 5/2005 |
| TW | 441050 A | 6/2001 |

* cited by examiner

SEMICONDUCTOR CHIP WITH FLIP CHIP CONTACTS AND A PASSIVATION LAYER WITH VARYING THICKNESS PORTIONS SURROUNDING CONTACT SURFACES OF THE SEMICONDUCTOR CHIP

CROSS REFERENCE TO RELATED APPLICATIONS

This application is a continuation of PCT/DE2004/002440, filed on Nov. 3, 2004, and titled "Semiconductor Chip With Flip Chip Contacts, and Process For Producing It," which claims priority under 35 USC §119 to German Application No. DE 103 52 349.9, filed on Nov. 6, 2003, and titled "Semiconductor Chip With Flip Chip Contacts, and Process For Producing It," the entire contents of which are hereby incorporated by reference.

FIELD OF THE INVENTION

The invention relates to a semiconductor chip with flip chip contacts, the flip chip contacts being arranged on the active top side of the semiconductor chip.

BACKGROUND

Semiconductor chips with flip chip contacts have the drawback that, after they have been applied to a circuit carrier, in particular both after the flip chip contacts have been soldered onto contact connection surfaces of the circuit carrier and after the space between semiconductor chip and circuit carrier has been filled with a filled plastic compound, they are at an increased risk of the formation of microcracks in the soldered joins and an increased risk of the formation of bubbles in the plastic compound, with microcracks then propagating even to the extent of delamination of the semiconductor chip from the circuit carrier.

SUMMARY

The invention provides a semiconductor chip in which the risk of delamination is avoided despite the formation of bubbles and cracks, and the scrap rate after soldering to a circuit carrier and after introduction of a plastic compound is reduced.

In accordance with the invention, a semiconductor chip comprises flip chip contacts that are arranged on contact surfaces of the active top side of the semiconductor chip. The contact surfaces are surrounded by a passivation layer which covers the active top side, leaving clear the contact surfaces. This passivation layer has thickened portions which surround the contact surfaces.

The above and still further features and advantages of the present invention will become apparent upon consideration of the following detailed description of specific embodiments thereof, particularly when taken in conjunction with the accompanying drawings wherein like reference numerals in the various figures are utilized to designate like components.

DETAILED DESCRIPTION

Figure 1:
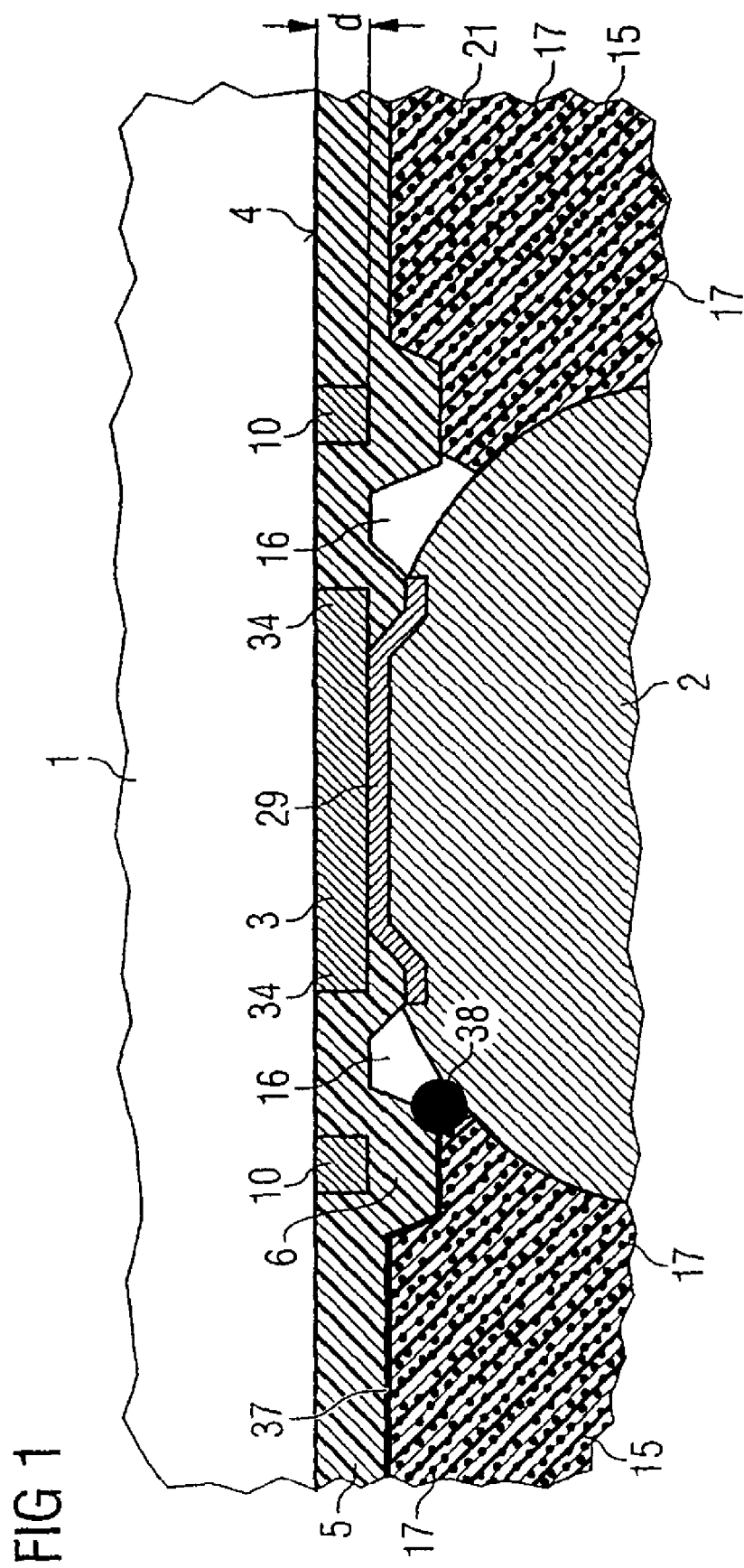
FIG. 1 shows a diagrammatic cross section through a sub-region of a semiconductor chip with the transition region from the semiconductor chip to a flip chip contact in accordance with the invention.

The invention provides a semiconductor chip with flip chip contacts, the flip chip contacts being arranged on contact surfaces of the active top side of the semiconductor chip. The contact surfaces are surrounded by a passivation layer which covers the active top side, leaving clear the contact surfaces. This passivation layer has thickened portions which surround the contact surfaces.

A semiconductor chip of this type with thickened portions in the passivation layer around the contact surfaces has the advantage that, in the event of cracks forming in the interface between passivation layer and plastic compound that is to be introduced during attachment of the semiconductor chip to a circuit carrier, the crack formation path in this interface is lengthened by the thickened portions. This removes the energy from crack propagation before complete delamination can occur. Furthermore, the thickened portion has the advantage that micropores are deliberately formed at the edges of the thickened portions, especially since the plastic compound is unable to completely fill a minimum distance between the contact surface with flip chip contact and the thickened portion, so that micropores of this type, which are formed around the flip chip contact in the region of the thickened portions, have a stop action with respect to microcrack propagation. The topographic structure which thickened portions of this type form around the contact surfaces and therefore around the flip chip contacts at the same time increases the adhesion surface area of the passivation area with respect to the plastic compound, resulting in an additional anchoring effect between semiconductor chip and plastic compound as a result of the thickened portions around the contact surfaces of the semiconductor chip.

The thickened portions may include the material of the passivation layer and a metallic bead. This metallic bead may be in the form of an interconnect ring around the contact surface, in which case the ring is designed to be open if an interconnect leads to the metal contact surface. The metallic bead in the form of an interconnect ring can be patterned with the uppermost metallization layer of the semiconductor chip. The dimensions of the ring opening are sufficiently large for the interconnect which leads to the contact surface not to touch the metallic ring forming the bead. In this case, the thickness of the metallic bead corresponds to the thickness of the uppermost metallization structure of the semiconductor chip.

This formation of a thickened portion from the material of the passivation layer and a metallic bead has the advantage that no additional process steps are required to form a thickened portion of the passivation layer of this nature. Rather, this thickened portion is formed automatically when the passivation layer is applied to the active top side of the semiconductor chip, leaving clear the contact surfaces. The advantageous effects of these thickened portions such that delamination of the semiconductor chip is prevented during or after mounting on the circuit carrier are retained irrespective of whether the thickened portion consists of passivation layer material or metal material.

If the passivation layer is arranged on a metallic bead to form the thickened portion, the invention also has the advantage that there is no need for any additional process steps to form thickened portions of this type around the contact surfaces.

In a further embodiment of the invention, the metallic bead is arranged in the form of a metallic line so as to form the thickened portion on the passivation layer. This embodiment of the invention has the advantage that the metallic bead can form a continuous ring as a thickened portion around the contact surfaces, since the passivation layer represents an insulation with respect to the interconnects which lead to the contact surfaces. A further advantage of this configuration is that metallic beads of this type comprising metal rings around a contact surface can be formed with sharp edges, thereby increasing the probability of the formation of micropores around a chip contact, so that crack propagations within the plastic compound are stopped. The effect of the thickened portions around a contact surface can also be improved if a plurality of continuous or open circular rings are formed around a contact surface. The anchoring action as mentioned above is also boosted by the use of more than one ring.

If it is known, in respect of a semiconductor chip, from what direction microcracks run toward the chip contacts, the thickened portions around a contact spot can be deliberately introduced where the risk of delamination is highest. In particular, it is possible for the thickened portions to be formed as a polygonal, circularly curved zigzag structure. Thickened portions which have a polygonal, circularly curved zigzag structure have the advantage that on the one hand they promote the formation of micropores to interrupt crack propagation and on the other hand they allow improved anchoring compared to annular thickened portions.

A further embodiment of the invention relates to a semiconductor wafer which has semiconductor chip positions which are arranged in rows and columns and for their part have contact surfaces that are surrounded by a passivation layer which includes thickened portions around the contact surfaces. A semiconductor wafer of this type has the advantage that a plurality of semiconductor chips with thickened portions around their contact surfaces can be prepared simultaneously in a parallel process. Moreover, it is also possible for flip chip contacts to be applied to the contact surfaces in the individual device positions on the semiconductor wafer, so that individual semiconductor chips according to the invention result after division of the semiconductor wafer.

Another embodiment of the invention relates to semiconductor devices which include semiconductor chips according to the invention. Semiconductor devices of this type have the advantage that delamination of their semiconductor chips with flip chip contacts from a circuit carrier arranged beneath them is prevented by the particular design of the semiconductor chips in accordance with the invention. The semiconductor device includes a plastic compound which is filled with particles and has micropores with a diameter of a few µm at the thickened portions which surround the flip chip contacts of the semiconductor chip. A semiconductor device of this type is advantageously protected from delamination in the interface between semiconductor material and plastic compound. In particular, the delamination of individual flip chip contacts is suppressed as far as possible, since propagation of microcracks is prevented by the micropores surrounding the flip chip contact.

A semiconductor device of this type includes a circuit carrier as well as the semiconductor chip. For its part, this circuit carrier has contact connection surfaces of a rewiring structure, the flip chip contacts of the semiconductor chip being secured to the contact connection surfaces. The space between the active top side of the semiconductor chip and the circuit carrier has the particle-filled plastic compound with the micropores at the thickened portions. A circuit carrier of this type may have a plurality of surface-mounted semiconductor chips and may form a semiconductor module.

It is not necessary for the entire semiconductor chip to be embedded in a plastic compound on the circuit carrier in order to benefit from the advantageous effects of the semiconductor chip structure according to the invention, in particular the advantageous effect of the thickened portion of the passivation layer around the contact surfaces. Rather, the effect of the invention is also achieved if only the space between the active top side of the semiconductor chip and the circuit carrier has the particle-filled plastic compound with the micropores at the thickened portions of the passivation layer.

A further embodiment of the invention relates to a panel which includes device positions, arranged in rows and columns, with semiconductor devices according to the invention. The advantageous effect of the structure according to the invention of semiconductor chips is also of benefit to the panel, especially since a panel of this type includes a plurality of semiconductor devices, and on account of the particular way in which the top side of the semiconductor chips has been structured, the risk of delamination of individual semiconductor chips in their device positions is reduced. It is therefore possible to improve the yield of functioning semiconductor devices per panel.

A process for producing a semiconductor wafer with semiconductor chip positions arranged in rows and columns includes the following process steps. First of all, a semiconductor wafer with semiconductor chip positions is produced. For this purpose, the uppermost metallization layer with interconnects and contact surfaces for flip chip contacts is patterned, the contact surfaces being surrounded by annular structures which are not in contact with the interconnects or contact surfaces. Then, the uppermost metallization layer is coated with a passivation layer of oxides or nitrides so as to cover the annular structures and the interconnects while leaving clear the contact surfaces. Due to the annular metal structures around the contact surfaces, thickened portions of the passivation layer are formed during this coating operation congruently with the annular structures in the uppermost metal layer.

A process of this type has the advantage that it is completely compatible with the process for producing semiconductor wafers and corresponding semiconductor chip positions on the semiconductor wafers used in semiconductor technology. No additional process steps are required to allow the particular structure according to the invention to be applied in each of the semiconductor chip positions. Only the patterning mask for the production of the uppermost metallization has to be adapted to the structure according to the invention.

An alternative process for producing a semiconductor wafer with semiconductor chip positions arranged in rows and columns includes the following process steps. Once again, first of all a semiconductor wafer with semiconductor chip positions in rows and columns is produced and the uppermost metallization layer with contact surfaces for flip chip contacts is patterned. Following the patterning, the uppermost metallization layer is provided with a passivation layer of oxides or nitrides so as to cover the interconnects and so as to leave clear the contact surfaces. Then, a further metallization is applied and patterned onto the passivation layer so as to form continuous circular or polygonal continuous structures around the contact surfaces.

In this process, it is advantageously possible to produce continuous circular or polygonal structures around the contact surfaces, but this requires a further metallization step which can only be introduced after application of the passivation layer in order to insulate the continuous structures from interconnects. In this process, the thickened portions on the passivation layer consist of a metal alloy in their uppermost region. The advantage lies not only in the continuous circular structure of the thickened portion but also in the sharp edges which can be realized with metal patterning of this nature after the production of the passivation layer. Sharp-edged structures of this nature have the advantage of increasing the probability of the formation of micropores during the application of a plastic compound between the semiconductor surface and the circuit carrier.

Further process steps, namely the semiconductor wafer being divided into individual semiconductor chips and then flip chip contacts being applied to the contact surfaces of the semiconductor chip, are required in order for semiconductor chips now to be produced from a wafer which has been produced in this way. On the other hand, it is also possible for the flip chip contacts to be applied in the semiconductor chip positions before the semiconductor wafer is divided into individual semiconductor chips. This has the advantage that the flip chip contacts can be positioned and soldered on over a large area and in parallel for a plurality of semiconductor chips.

A process for producing a panel with a plurality of semiconductor device positions includes the following process steps. First of all, a semiconductor chip according to the invention is produced using one of the processes for producing a wafer. In parallel with this, it is possible to produce a circuit carrier having a plurality of semiconductor device positions, the circuit carrier, on its top side, having rewiring structures with contact connection surfaces for flip chip contacts in the semiconductor positions. Furthermore, the rewiring structure of the circuit carrier includes rewiring lines leading to through-contacts. A further rewiring structure, which in the semiconductor positions leads to outer contact surfaces of semiconductor devices, is applied to the rear side of the circuit carrier.

This process for producing a panel has two advantages; first of all, a plurality of process steps are carried out simultaneously for a plurality of semiconductor devices, and secondly device outer contacts which are significantly larger than the maximum size of the flip chip contacts of the semiconductor chip can be applied to the rear side of the circuit carrier, since for a panel of this type the circuit carrier can be made as large as desired and can be adapted to the customer's footprint. All that is then required to produce semiconductor devices from a panel of this type is the process step of dividing the panel into individual semiconductor devices.

Thus, if there is a risk of delamination with or without popcorn effect, the invention allows the propagation of microcracks and therefore the delamination to be prevented, by configuring the semiconductor chip in such a manner that by far the most probable occurrence of microcracks, at the interface between plastic compound and active top side of the semiconductor chips, is prevented by the special formation of the area surrounding flip chip contacts.

The special structure of the thickened portions around the flip chip contacts distributes the energy of the microcracks in the interface. These special structures may be metal lines around the contact surfaces of the flip chip contacts and can be produced using the uppermost metallization step of the semiconductor chip or additionally by adding a further patterned metallization. The structure of these metal lines around the contact surfaces may be annular, in serpentine form, meandering or in zigzag form. The more complex the topographic structure, the more the reliability of the semiconductor devices produced using such chips is improved. In this context, three advantageous effects of additional thickened portions around the flip chip contacts of a semiconductor chip are exploited:

1. Lengthening the microcrack path due to the thickened portions and the recesses which can be produced between the thickened portions, with the microcrack energy being distributed harmlessly.
2. Production of micropores along the edges of the thickened portions or around the contact surfaces, the micropores being formed by virtue of the fact that the distance between the thickened portions and the contact surfaces cannot be completely filled by the plastic compound filled with particles. The micropores act as microcrack stop zones and prevent further propagation of the microcracks and therefore delamination.
3. Improvement to the adhesion of the plastic compound filled with particles to the top side of the semiconductor chip, since on the one hand the adhesion surface area is increased and on the other hand the topographic structure of the thickened portions improves anchoring of the plastic compound to the semiconductor chip.

The invention is now described in further detail with reference to the figures.

FIG. 1 shows a diagrammatic cross section through a sub-region of a semiconductor chip 1, in the transition region from the semiconductor chip 1 to a flip chip contact 2. In this zone, the semiconductor chip 1 has, on its active top side 4, a contact surface 3 which is coated with a solderable coating 29 and on which is arranged a flip chip contact 2. A passivation layer 5 is arranged around the contact surface 3 and partially also on the edge regions 34 of the contact surface 3, leaving clear a central region of the contact surface 3, which is covered with the solderable coating 29.

The passivation layer 5 covers an open circular structure 10, resulting in a thickened portion 6 of the passivation layer 5 over this open circular structure 10. The distance between the resulting thickened portion 6 and the edge region 34 of the contact surface 3 is so small that micropores 16 can form during filling of the space 21 between the semiconductor chip 1 and a circuit carrier (not shown here) with a plastic compound 15. The thickness d of the open circular structure 10 corresponds with the thickness of the contact surface 3, since in this embodiment of the invention the circular structure 10 is produced with the uppermost metallization layer, i.e. at the same time as the contact surface 3 is being formed and patterned, on the active top side 4 of the semiconductor chip 1.

In the present exemplary embodiment, the plastic compound 15 is filled with particles 17, so that in practice it is not possible to completely fill the minimum distance of a few micrometers (e.g., 3 micrometers) between the thickened portion 6 and the edge region 34 of the contact surface 3 with plastic compound 15. The line 37 in principle shows a microcrack which has propagated in the interfacial layer between passivation layer 5 and plastic compound 15, for example starting from a small bubble (not shown). This microcrack is stopped at the micropore 16, as indicated by the black dot 38. The further advantages which can be achieved with an annular structure of this type around a contact surface 3 have already been discussed extensively and will not be repeated here.

Figure 2:
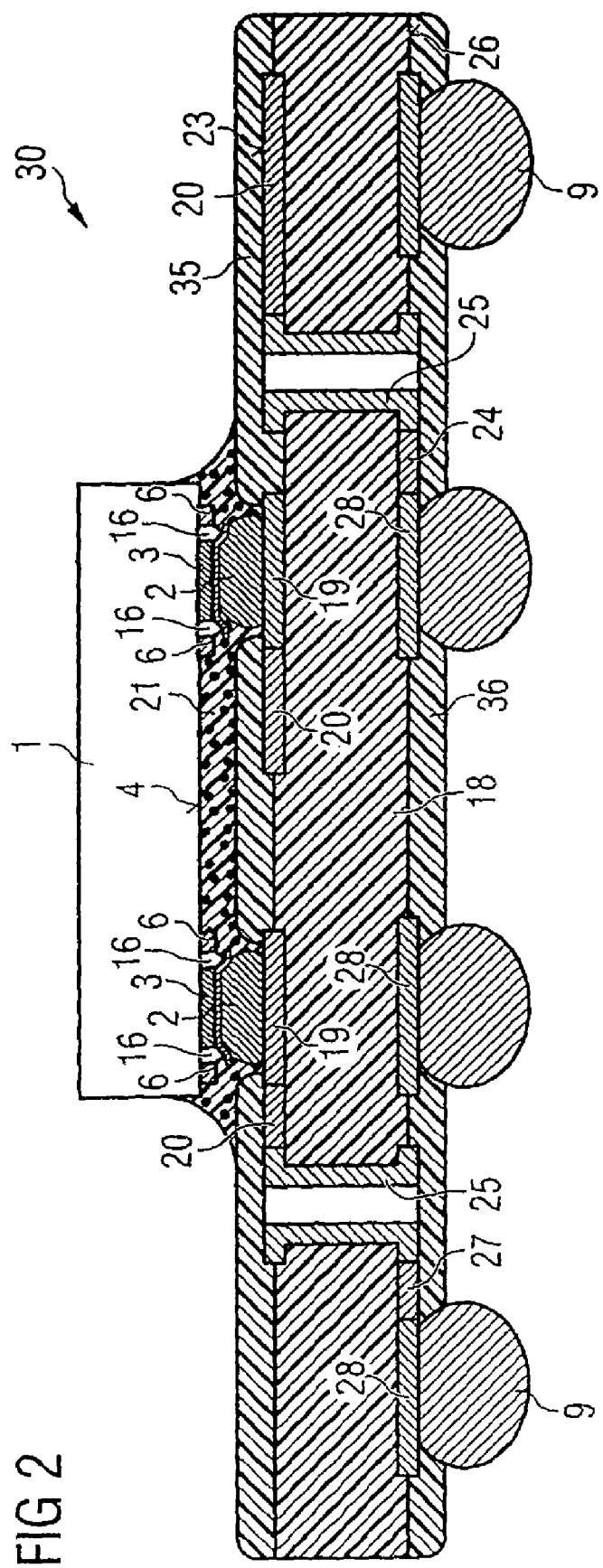
FIG. 2 shows a diagrammatic cross section through a semiconductor device with a semiconductor chip and with a circuit carrier in accordance with the invention.

FIG. 2 shows a diagrammatic cross section through a semiconductor device 30 including a semiconductor chip 1 and a circuit carrier 18. With devices of this type, such as the semiconductor device 30 shown in FIG. 2, the advantages are that delamination of the semiconductor chip 1 and of the plastic compound 15 is prevented in the interfacial region between the active top side 4 of the semiconductor chip 1 and the plastic compound 15. In particular, in the case of the semiconductor device 30 shown here, which represents an example of a surface-mounted semiconductor chip 1, the scrap rate during production is reduced by the configuration of the semiconductor chip 1 according to the invention.

Devices with the same functions as in FIG. 1 are denoted by the same reference designations and not explained again. FIG. 2 shows that thickened portions 6 are arranged in a ring around the flip chip contacts 2 of the semiconductor chip 1, at which thickened portions 6 the active top side 4 of the semiconductor chip 1 is embedded in a plastic compound 15. The formation of cracks, as usually occurs in the critical interfacial layer between semiconductor chip 1 and plastic compound 15, is absorbed in energy terms by the thickened portions 6 of the semiconductor chip 1 or stopped from propagation by the formation of micropores at the thickened portions, since the stress peaks at the micropores are reduced.

The semiconductor chip 1 is fixed on the circuit carrier 18 by the flip chip contacts 2 as a result of the flip chip contacts 2 being soldered onto corresponding contact connection surfaces 19 of the circuit carrier. The circuit carrier 18 is a fiber-reinforced plastic plate which includes a rewiring structure 20 on its top side 23, the rewiring structure 20 including rewiring lines 24 which are electrically connected to through-contacts 25 leading to the rear side 26 of the circuit carrier 18. A further rewiring structure 27, which includes rewiring lines 24 connecting the through-contacts 25 to outer contact surfaces 28 on which are arranged outer contacts 9 of the semiconductor device 30, is arranged on the rear side 26 of the circuit carrier 18.

The outer contacts 9 of the semiconductor device 30 can be made significantly larger than the flip chip contacts 2 of the semiconductor chip 1, especially since the circuit carrier 18 can be made as large as desired with respect to the size of the semiconductor chip 1. Both the top side 23 of the circuit carrier 18 and the rear side 26 are coated with soldering stop resist layers 35 and 36, leaving clear the contact connection surfaces 19 and the outer contact surfaces 28, in order for the rewiring structures 20 and 27 to be electrically insulated and protected from damage. Moreover, the soldering stop resist layers 35 and 36 ensure that the material of the flip chip contacts 2 or the outer contacts 9 does not spread over the rewiring lines 24 during soldering.

Figure 3:
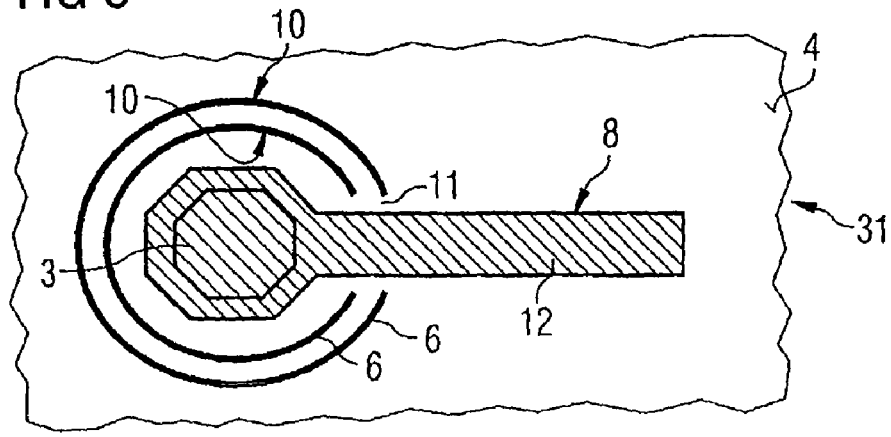
FIG. 3 shows a diagrammatic plan view of a semiconductor chip with a thickened portion structure in accordance with a first embodiment of the invention.

FIG. 3 shows a diagrammatic plan view onto a thickened portion structure 31 of a first embodiment of the invention. To illustrate the structure on the active top side 4 of the semiconductor chip, the passivation layer has been omitted. Only the uppermost metallization layer 8 can be seen; this metallization layer includes an interconnect 12 and a contact surface 3, which are electrically connected to one another. Two open circular structures 10 which do not touch the interconnects 12 are arranged around the contact surface 3, the opening 11 in the open circular structures 10 ensuring that they do not make electrical contact with the interconnect 12. In this first embodiment of the invention, these structures 10 are of the same thickness as the interconnect 12 and have the effect that, after application of a passivation layer, for example comprising silicon nitride or silicon oxide, to the active top side 4 of the semiconductor chip, leaving clear the contact surface 3, circular thickened portions 6 of the passivation layer are formed.

Figure 4:
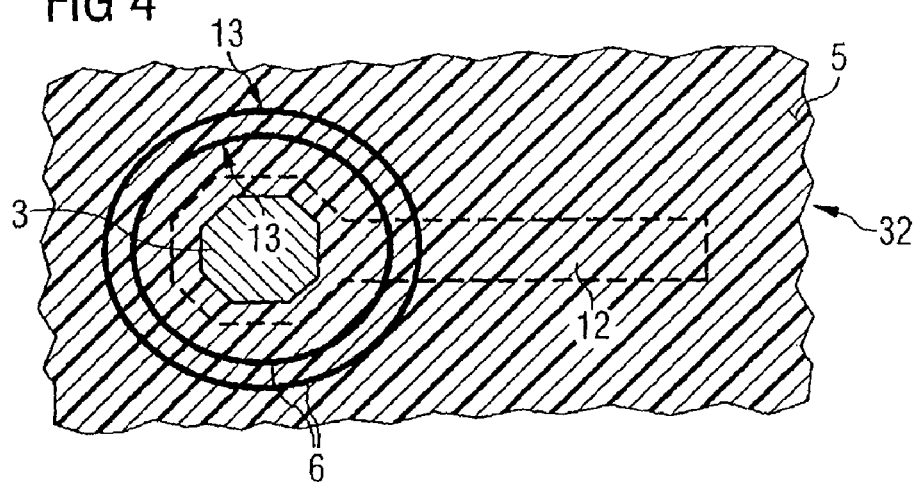
FIG. 4 shows a diagrammatic plan view of a semiconductor chip with a thickened portion structure in accordance with a second embodiment of the invention.

FIG. 4 shows a diagrammatic plan view onto a thickened portion structure 32 of a second embodiment of the invention. The thickened portion structure 32, unlike the thickened portion structure 31 shown in FIG. 3, comprises continuous circular metal rings 13 which, however, are only applied to the active top side of a semiconductor chip by a further metallization 22 following the application of a passivation layer 5. This continuous circular structure, which here comprises two rings, forms two rings 13 which do not have an opening and consequently impede the propagation of incipient microcracks in every direction when a plastic compound is applied to these semiconductor chips.

Figure 5:
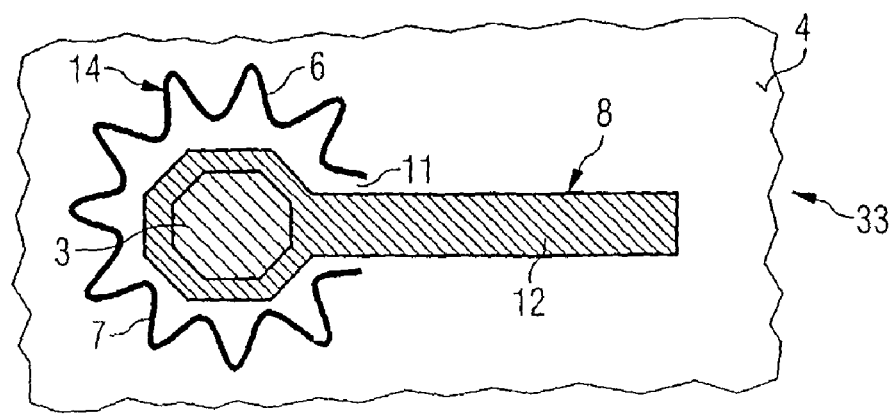
FIG. 5 shows a diagrammatic plan view of a semiconductor chip with a thickened portion structure in accordance with a third embodiment of the invention.

FIG. 5 shows a diagrammatic plan view of a thickened portion structure 33 of a third embodiment of the invention. This thickened portion structure 33 differs from the thickened portion structure 31 shown in FIG. 3 by virtue of the fact that it has a polygonal, circularly curved zigzag structure 14. In this third embodiment of the invention too, as in FIG. 3, the passivation layer is omitted from the drawing in order to make clear the structure of both the interconnect 12 and the contact surface 3 and also of the polygonal, circularly curved zigzag structure 14. This polygonal structure of the thickened portion 6, which in this case was formed on account of a metallic bead 7, demonstrates that the thickened portions 6 may have any desired patterns, with the proviso that they are arranged at a short distance from the contact surface 3 on the active top side 4 of the semiconductor chip, in order also to allow the formation of micropores between the flip chip contact (not shown here) and thickened portion structure 33.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed:

1. A semiconductor chip comprising:
   a plurality of flip chip contacts that are arranged on contact surfaces of an active top side of the semiconductor chip; and
   a passivation layer surrounding the contact surfaces and covering portions of the active top side of the semiconductor chip, wherein the passivation layer includes thickened portions that have a greater thickness than other portions of the passivation layer and that are spaced at a distance from the contact surfaces by recesses positioned between the thickened portions.

2. A semiconductor chip comprising:
   a plurality of flip chip contacts that are arranged on contact surfaces of an active top side of the semiconductor chip; and
   a passivation layer surrounding the contact surfaces and covering portions of the active top side of the semiconductor chip, wherein the passivation layer includes thickened portions that have a greater thickness than other portions of the passivation layer and that are spaced a distance from the contact surfaces;
   wherein the thickened portions include material of the passivation layer and a metallic bead.

3. The semiconductor chip of claim 2, wherein a thickness of the metallic bead corresponds with a thickness of an uppermost metallization structure disposed at the active top side of the semiconductor chip.

4. A semiconductor chip comprising:
- a plurality of flip chip contacts that are arranged on contact surfaces of an active top side of the semiconductor chip; and
- a passivation layer surrounding the contact surfaces and covering portions of the active top side of the semiconductor chip, wherein the passivation layer includes thickened portions that have a greater thickness than other portions of the passivation layer and that are spaced a distance from the contact surfaces;
- wherein the passivation layer is arranged on a metallic bead to form the thickened portions.

5. A semiconductor chip comprising:
- a plurality of flip chip contacts that are arranged on contact surfaces of an active top side of the semiconductor chip; and
- a passivation layer surrounding the contact surfaces and covering portions of the active top side of the semiconductor chip, wherein the passivation layer includes thickened portions that have a greater thickness than other portions of the passivation layer and that are spaced a distance from the contact surfaces;
- wherein a metallic bead is arranged on the passivation layer to form the thickened portions.

6. The semiconductor chip of claim 1, wherein the thickened portions include a plurality of open circular structures that surround a contact surface, and the semiconductor chip includes an interconnect disposed on the active surface that leads through the openings in the open circular structures to the contact surface surrounded by the open circular structures.

7. The semiconductor chip of claim 1, wherein the thickened portions include a plurality of continuous circular structures surrounding a contact surface.

8. A semiconductor chip comprising:
- a plurality of flip chip contacts that are arranged on contact surfaces of an active top side of the semiconductor chip; and
- a passivation layer surrounding the contact surfaces and covering portions of the active top side of the semiconductor chip, wherein the passivation layer includes thickened portions that have a greater thickness than other portions of the passivation layer and that are spaced a distance from the contact surfaces;
- wherein the thickened portions are formed as a polygonal, circularly curved zigzag structure.

9. A semiconductor wafer including a plurality of semiconductor chips as recited in claim 1, wherein the semiconductor chips are arranged in rows and columns on the wafer.

10. A semiconductor device including the semiconductor chip of claim 1.

11. A semiconductor device including a semiconductor chip, the semiconductor chip comprising:
- a plurality of flip chip contacts that are arranged on contact surfaces of an active top side of the semiconductor chip; and
- a passivation layer surrounding the contact surfaces and covering portions of the active top side of the semiconductor chip, wherein the passivation layer includes thickened portions that have a greater thickness than other portions of the passivation layer and that are spaced a distance from the contact surfaces;
- wherein the flip chip contacts and the surrounding thickened portions are embedded in a plastic compound, the plastic compound being filled with particles and comprising micropores located at the thickened portions.

12. The semiconductor device of claim 11, wherein the semiconductor chip is arranged on a circuit carrier, the circuit carrier comprises a rewiring structure with contact connection surfaces, the flip chip contacts of the semiconductor chip are secured to the contact connection surfaces, and the particle-filled plastic compound with the micropores at the thickened portions is disposed between the active top side of the semiconductor chip and the circuit carrier.

13. A panel including device positions that are arranged in rows and columns, wherein semiconductor devices as recited in claim 10 are disposed at the device positions.

* * * * *